United States Patent
Nakajima

(10) Patent No.: US 12,412,839 B2
(45) Date of Patent: Sep. 9, 2025

(54) SEMICONDUCTOR DEVICE HAVING AN INTERCONNECTION INCLUDING PLURAL METAL LAYERS, AND MANUFACTURING METHOD THEREOF

(71) Applicant: Kioxia Corporation, Tokyo (JP)

(72) Inventor: Akira Nakajima, Yokkaichi Mie (JP)

(73) Assignee: Kioxia Corporation, Tokyo (JP)

(*) Notice: Subject to any disclaimer, the term of this patent is extended or adjusted under 35 U.S.C. 154(b) by 610 days.

(21) Appl. No.: 17/590,057

(22) Filed: Feb. 1, 2022

(65) Prior Publication Data

US 2023/0069025 A1 Mar. 2, 2023

(30) Foreign Application Priority Data

Aug. 25, 2021 (JP) .................................. 2021-137364

(51) Int. Cl.
*H01L 23/535* (2006.01)
*H01L 21/768* (2006.01)
*H01L 23/532* (2006.01)

(52) U.S. Cl.
CPC ...... *H01L 23/535* (2013.01); *H01L 21/76805* (2013.01); *H01L 21/76846* (2013.01); *H01L 21/76895* (2013.01); *H01L 23/53223* (2013.01); *H01L 23/53238* (2013.01); *H01L 23/53266* (2013.01)

(58) Field of Classification Search
CPC ......... H01L 21/76805; H01L 21/76846; H01L 23/535; H01L 21/76895; H01L 23/53223; H01L 23/53238; H01L 23/53266; H01L 21/76843; H01L 21/76849; H01L 21/76885; H01L 21/76841; H01L 23/532; H01L 21/768
See application file for complete search history.

(56) References Cited

U.S. PATENT DOCUMENTS

| | | | |
|---|---|---|---|
| 6,492,735 B1 | 12/2002 | Matsubara | |
| 6,900,539 B2 | 5/2005 | Motoyama | |
| 6,949,832 B2* | 9/2005 | Kunishima | ....... H01L 21/76864 257/E21.174 |
| 8,030,207 B2 | 10/2011 | Akiyama et al. | |
| 9,281,276 B2 | 3/2016 | Usami et al. | |
| 10,468,457 B1* | 11/2019 | Zeng | ...................... H10N 50/80 |
| 2004/0072028 A1* | 4/2004 | Ohsawa | ................. G11B 5/737 |

(Continued)

FOREIGN PATENT DOCUMENTS

| | | | |
|---|---|---|---|
| JP | 63145766 | * | 6/1986 |
| JP | H0741949 A | | 2/1995 |

(Continued)

*Primary Examiner* — William B Partridge
*Assistant Examiner* — Felix B Andrews
(74) *Attorney, Agent, or Firm* — Holtz, Holtz & Volek PC

(57) ABSTRACT

A semiconductor device according to the present embodiment comprises a first conductive layer. An interconnection is provided above the first conductive layer. A contact is provided between the first conductive layer and the interconnection. The interconnection includes a first metal layer containing hexagonal titanium (Ti) provided above the first conductive layer, a second metal layer containing tantalum (Ta) having a body-centered cubic lattice-like structure and provided on the first metal layer, and a first wiring material provided on the second metal layer.

8 Claims, 6 Drawing Sheets

(56) References Cited

U.S. PATENT DOCUMENTS

| | | | |
|---|---|---|---|
| 2005/0170105 A1 | 8/2005 | Fartash | |
| 2008/0042291 A1* | 2/2008 | Knarr | H01L 23/485 |
| | | | 257/762 |
| 2010/0215991 A1* | 8/2010 | Kurokawa | G11B 5/737 |
| | | | 428/846.8 |
| 2013/0252417 A1* | 9/2013 | Ishizaka | C23C 14/18 |
| | | | 438/643 |
| 2020/0135558 A1* | 4/2020 | Standaert | H01L 23/5226 |
| 2021/0217698 A1* | 7/2021 | Cheng | H01L 23/53257 |
| 2021/0335663 A1* | 10/2021 | Hsueh | H01L 21/7684 |
| 2021/0407852 A1* | 12/2021 | Yeh | H01L 23/5226 |
| 2022/0068805 A1* | 3/2022 | Lee | H01L 29/7827 |
| 2022/0246528 A1* | 8/2022 | Choi | H01L 29/66795 |
| 2022/0246534 A1* | 8/2022 | Chin | H01L 21/76867 |
| 2022/0293753 A1* | 9/2022 | Kim | H01L 21/76834 |
| 2022/0352018 A1* | 11/2022 | Cheng | H01L 23/53266 |
| 2022/0384256 A1* | 12/2022 | Lin | H01L 21/76844 |
| 2022/0415785 A1* | 12/2022 | Lee | H01L 21/76856 |
| 2023/0065045 A1* | 3/2023 | Lin | H01L 21/76805 |
| 2023/0116911 A1* | 4/2023 | Lee | H01L 23/53228 |
| | | | 257/621 |
| 2023/0154792 A1* | 5/2023 | Chin | H01L 23/5226 |
| | | | 257/751 |
| 2023/0154850 A1* | 5/2023 | Chin | H01L 21/76846 |
| | | | 257/435 |
| 2023/0290678 A1* | 9/2023 | Hsueh | H01L 21/76895 |
| 2023/0317514 A1* | 10/2023 | Pan | H01L 21/76846 |
| | | | 257/192 |
| 2023/0317520 A1* | 10/2023 | Lin | H01L 21/76834 |
| | | | 438/586 |
| 2023/0326964 A1* | 10/2023 | Baek | H01L 29/78696 |
| 2023/0386920 A1* | 11/2023 | Lu | H01L 29/401 |
| 2023/0402320 A1* | 12/2023 | Nian | H01L 21/76849 |
| 2024/0162085 A1* | 5/2024 | Xu | H01L 23/5226 |
| 2024/0213087 A1* | 6/2024 | van der Straten | |
| | | | H01L 21/76802 |

FOREIGN PATENT DOCUMENTS

| | | |
|---|---|---|
| JP | H11265890 A | 9/1999 |
| JP | 2001284449 A | 10/2001 |
| JP | 3329380 B2 | 7/2002 |
| JP | 2004074603 A | 3/2004 |
| JP | 3540302 B2 | 4/2004 |
| JP | 2004342977 A | 12/2004 |
| JP | 2006216787 A | 8/2006 |
| JP | 2008277531 A | 11/2008 |
| JP | 4555540 B2 | 7/2010 |
| TW | 201519393 A | 5/2015 |

* cited by examiner

SEMICONDUCTOR DEVICE HAVING AN INTERCONNECTION INCLUDING PLURAL METAL LAYERS, AND MANUFACTURING METHOD THEREOF

CROSS REFERENCE TO RELATED APPLICATIONS

This application is based upon and claims the benefit of priority from the prior Japanese Patent Application No. 2021-137364, filed on Aug. 25, 2021, the entire contents of which are incorporated herein by reference.

FIELD

The embodiments of the present invention relate to a semiconductor device and manufacturing method thereof.

BACKGROUND

An interconnection or a via contact used for multilayer wiring or the like in a semiconductor device may include a barrier metal that covers an inner wall of a groove for the interconnection or an inner wall of a via hole and a wiring material that is filled inside the barrier metal. The barrier metal is provided for preventing diffusion of the wiring material into the semiconductor device and is required to have a low resistance in order to reduce a wiring resistance or a contact resistance. Further, the material for the barrier metal or the wiring material is required to be inexpensive in order to reduce the manufacturing cost of the semiconductor device.

DETAILED DESCRIPTION

Figure 1:
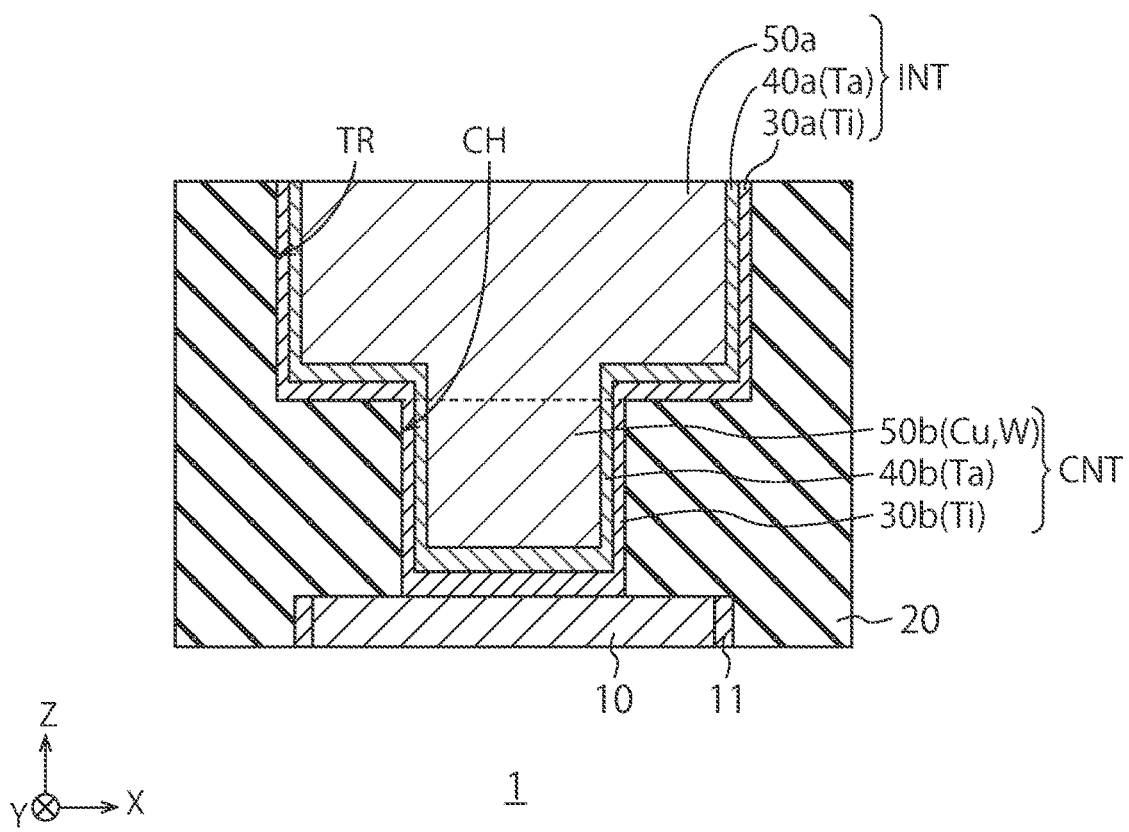
FIG. 1 is a cross-sectional view illustrating a configuration example of a semiconductor device according to a first embodiment.

Embodiments will now be explained with reference to the accompanying drawings. The present invention is not limited to the embodiments. In the present specification and the drawings, elements identical to those described in the foregoing drawings are denoted by like reference characters and detailed explanations thereof are omitted as appropriate.

A semiconductor device according to the present embodiment comprises a first conductive layer. An interconnection is provided above the first conductive layer. A contact is provided between the first conductive layer and the interconnection. The interconnection includes a first metal layer containing hexagonal titanium (Ti) provided above the first conductive layer, a second metal layer containing tantalum (Ta) having a body-centered cubic lattice-like structure and provided on the first metal layer, and a first wiring material provided on the second metal layer.

First Embodiment

FIG. 1 is a cross-sectional view illustrating a configuration example of a semiconductor device 1 according to a first embodiment. The semiconductor device 1 includes a lower interconnection 10, a contact CNT, an upper interconnection INT, and an interlayer dielectric film 20. The semiconductor device 1 is, for example, a semiconductor device having a multilayer wiring layer.

The lower interconnection 10 is buried in the interlayer dielectric film 20 and is made of a conductive material, for example, copper, tungsten, or aluminum. A barrier film 11 is provided around the lower interconnection 10. A conductive material, for example, titanium (Ti), titanium nitride (TiN), tantalum (Ta), or tantalum nitride (TaN) is used for the barrier film 11. It suffices that the lower interconnection 10 is a conductive layer, and its material, shape, and size are not limited.

The contact CNT is provided on the lower interconnection 10. The contact CNT is provided between the upper interconnection INT and the lower interconnection 10 to electrically connect them to each other. The contact CNT is substantially circular, substantially elliptical, or substantially polygonal as viewed in a direction from the upper interconnection INT to the lower interconnection 10 (a Z-direction).

The contact CNT includes a metal layer 30b, a metal layer 40b, and a wiring material 50b. The metal layer 30b covers an inner wall of a contact hole CH. The metal layer 40b is provided on the metal layer 30b in the contact hole CH. The wiring material 50b is filled in the contact hole CH on the metal layer 40b.

A conductive material containing any of tungsten (W), aluminum (Al), and copper (Cu) is used for the wiring material 50b, for example.

The metal layers 30b and 40b serve as so-called "barrier film(s)" and are provided for preventing diffusion of the wiring material 50b into the interlayer dielectric film 20, the lower interconnection 10, and a semiconductor element around them. Therefore, the metal layers 30b and 40b are required to have a certain thickness so as to prevent diffusion of the material (for example, tungsten, aluminum, or copper) of the wiring material 50b. Meanwhile, each of the metal layers 30b and 40b is preferably made of a low-resistance material so as not to interfere with an electrical contact resistance between the contact CNT and the lower interconnection 10. Titanium (Ti) is used for the metal layer 30b, for example. Tantalum (Ta) is used for the metal layer 40b, for example. In this case, it is preferable that the thickness of each of the metal layers 30b and 40b is about 7.5 nm or more, for example. Accordingly, the metal layers 30b and 40b can serve as the barrier films and can also reduce the contact resistance between the contact CNT and the lower interconnection 10.

The metal layers 30b and 40b are provided between the lower interconnection 10 and the wiring material 50b and between the interlayer dielectric film 20 and the wiring material 50b. Accordingly, the metal layers 30b and 40b can prevent diffusion of the wiring material 50b.

Next, the materials for the metal layers 30b and 40b are described.

As described above, titanium (Ti) is used for the metal layer 30b, for example, and tantalum (Ta) is used for the metal layer 40b, for example. Titanium is advantageous in that it is less expensive than tantalum and is less likely to form particles in a deposition chamber. Meanwhile, tantalum is more expensive than titanium and is likely to cause particles in a deposition chamber, but can be lower than titanium in the specific resistance value depending on the crystal lattice. For example, titanium has a hexagonal crystal structure, and its specific resistance value is about 140 μohm·cm. On the other hand, a specific resistance value of tantalum having a body-centered cubic lattice-like structure (hereinafter, also α-Ta) is about 24 to 50 μohm·cm and is much lower than the specific resistance value of titanium. Meanwhile, a specific resistance value of tetragonal tantalum (hereinafter, also β-Ta) is about 200 μohm·cm and is higher than the specific resistance value of titanium. Therefore, the specific resistance value of α-Ta is lower than those of titanium and β-Ta. For this reason, it is preferable to use α-Ta for the metal layer 40b. The crystal plane orientation of α-Ta is (110), and the crystal plane orientation of β-Ta is (002).

The reason why titanium is used for the metal layer 30b as an underlayer of the metal layer 40b is described below.

The crystal structure of tantalum (α-Ta and β-Ta) changes depending on a crystalline state (for example, a crystal interplanar spacing) of an underlayer in deposition of tantalum. For example, the crystal interplanar spacing of α-Ta is about 2.34 angstroms. The crystal interplanar spacing of β-Ta is about 2.66 angstroms. In a case where the crystal interplanar spacing of the metal layer 30b serving as an underlayer of the metal layer 40b is close to that of the α-Ta, the metal layer 40b becomes α-Ta. Meanwhile, in a case where the crystal interplanar spacing of the metal layer 30b serving as an underlayer of the metal layer 40b is close to that of the β-Ta, the metal layer 40b becomes β-Ta.

In a case where the metal layer 30b is titanium having a crystal plane with a plane orientation (002), its crystal interplanar spacing is about 2.34 angstroms. Meanwhile, in a case where the metal layer 30b is titanium having a crystal plane with a plane orientation (100), its crystal interplanar spacing is about 2.56 angstroms. That is, titanium having a crystal plane with a plane orientation (002) has a crystal interplanar spacing closer to (substantially equal to) the crystal interplanar spacing of α-Ta having a crystal plane with a plane orientation (110) than to the crystal interplanar spacing of β-Ta having a crystal plane with a plane orientation (002). On the other hand, titanium having a crystal plane with a plane orientation (100) has a crystal interplanar spacing close to that of β-Ta. Therefore, in a case where the metal layer 30b is titanium having a crystal plane with a plane orientation (002), the metal layer 40b (tantalum) formed on the metal layer 30b becomes α-Ta having a relatively low specific resistance value. Meanwhile, in a case where the metal layer 30b is titanium having a crystal plane with a plane orientation (100), the metal layer 40b (tantalum) formed on the metal layer 30b becomes β-Ta having a relatively high specific resistance value.

Therefore, it is preferable that the metal layer 30b is made of hexagonal titanium having a crystal plane with a plane orientation (002). Accordingly, it is possible to form α-Ta having a relatively low specific resistance value as the metal layer 40b on the metal layer 30b. That is, while inexpensive titanium is used as the metal layer 30b, it is possible to deposit α-Ta having a low specific resistance value as the metal layer 40b on the metal layer 30b. Accordingly, the metal layers 30b and 40b as barrier films can be formed inexpensively with their specific resistance values reduced to some extent.

The upper interconnection INT is provided above the lower interconnection 10 and on the contact CNT. The upper interconnection INT is electrically connected to the lower interconnection 10 via the contact CNT. The upper interconnection INT overlaps the contact CNT as viewed in the direction from the upper interconnection INT to the lower interconnection 10 (the Z-direction), and is provided in a trench TR extending in a Y-direction.

The upper interconnection INT includes a metal layer 30a covering an inner wall of the trench TR, a metal layer 40a provided on the metal layer 30a in the trench TR, and a wiring material 50a filled in the trench TR on the metal layer 40a. The metal layers 30a and 40a serve as so-called "barrier film(s)" and are provided for preventing diffusion of the wiring material 50a into the interlayer dielectric film 20 and a semiconductor element around them. Low-resistance metal, for example, tungsten (W), aluminum (Al), or copper (Cu) is used for the wiring material 50a. Therefore, the metal layers 30a and 40a are required to have a certain thickness so as to prevent diffusion of the material (tungsten, aluminum, copper, or the like) of the wiring material 50a. Meanwhile, each of the metal layers 30a, 30b, 40a and 40b is preferably made of a low-resistance material so as not to interfere with an electrical contact resistance between the contact CNT or the upper interconnection INT and the lower interconnection 10, as described above.

The wiring material 50a may be formed simultaneously with the wiring material 50b, and may be a single material formed continuously.

In the present embodiment, it is preferable that the metal layer 30a contains titanium having a hexagonal crystal structure and a crystal plane with a plane orientation (002), as with the metal layer 30b. The crystal interplanar spacing of the metal layer 30a thus becomes close to (substantially equal to) that of α-Ta. Therefore, α-Ta having a relatively low specific resistance value can be formed as the metal layer 40a on the metal layer 30a. The metal layer 30a is a single layer that is continuous with the metal layer 30b in the contact CNT and can be formed simultaneously with the metal layer 30b.

The metal layer 40a is formed on the metal layer 30a, and contains tantalum having a body-centered cubic lattice-like structure and a crystal plane with a plane orientation (110) (α-Ta), as with the metal layer 40b. The metal layer 40a is a single layer that is continuous with the metal layer 40b in the contact CNT and can be formed simultaneously with the metal layer 40b.

As described above, it is preferable that the metal layer 30a is made of hexagonal titanium having a crystal plane with a plane orientation (002). Accordingly, it is possible to form α-Ta having a relatively low specific resistance value as the metal layer 40a on the metal layer 30a. That is, while inexpensive titanium is used as the metal layer 30a, it is possible to deposit α-Ta having a low specific resistance value as the metal layer 40a on the metal layer 30a. Accordingly, the metal layers 30a and 40a as barrier films can be formed inexpensively with their specific resistance values reduced to some extent. Further, the metal layers 30a and 40a are formed simultaneously with the metal layers 30b and 40b to form continuous barrier films, respectively. Therefore, it suffices that the metal layers 30a and 40a have the characteristics including the material and the thickness that are the same as those of the metal layers 30b and 40b, respectively.

Next, a manufacturing method of the semiconductor device 1 according to the present embodiment is described.

FIGS. 2 to 5 are cross-sectional views illustrating an example of a manufacturing method of a semiconductor device according to the first embodiment. First, a semiconductor element is formed on a semiconductor substrate (not illustrated). The semiconductor element may be, for example, a transistor, a capacitor element, or a resistor element. Next, the interlayer dielectric film 20 is formed on the semiconductor substrate to cover the semiconductor element. A silicon oxide film, for example, is used as the interlayer dielectric film 20.

Figure 2:
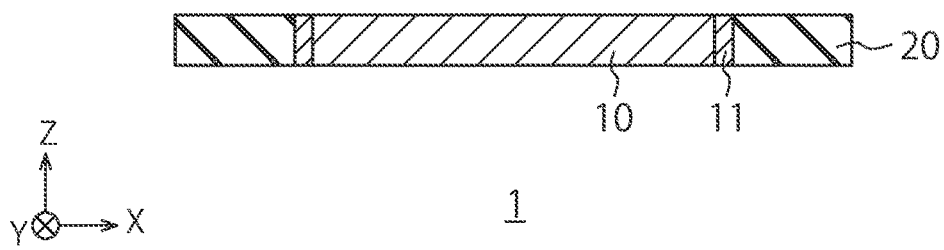
FIGS. 2 to 5 are cross-sectional views illustrating an example of a manufacturing method of a semiconductor device according to the first embodiment.

Next, a contact hole or a trench for interconnection is formed in the interlayer dielectric film 20 by lithography and etching. Subsequently, the barrier film 11 is formed on an inner wall of the contact hole or the trench, and a conductive material is buried in the contact hole or the trench. The conductive material is formed as the lower interconnection 10 on the barrier film 11 in the contact hole or the trench. In this manner, the structure illustrated in FIG. 2 is obtained.

Figure 3:
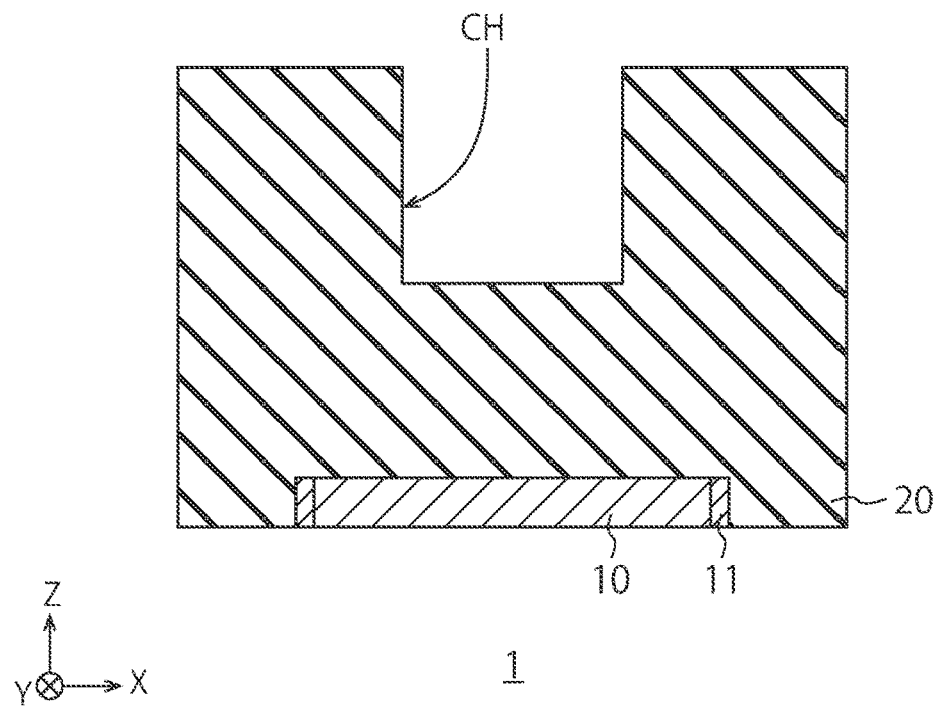

Next, as illustrated in FIG. 3, the interlayer dielectric film 20 is further formed above the lower interconnection 10. An upper portion of the interlayer dielectric film 20 is then etched by lithography and etching in a forming region of the contact CNT. In this manner, the contact hole CH illustrated in FIG. 3 is formed in the upper portion of the interlayer dielectric film 20.

Figure 4:
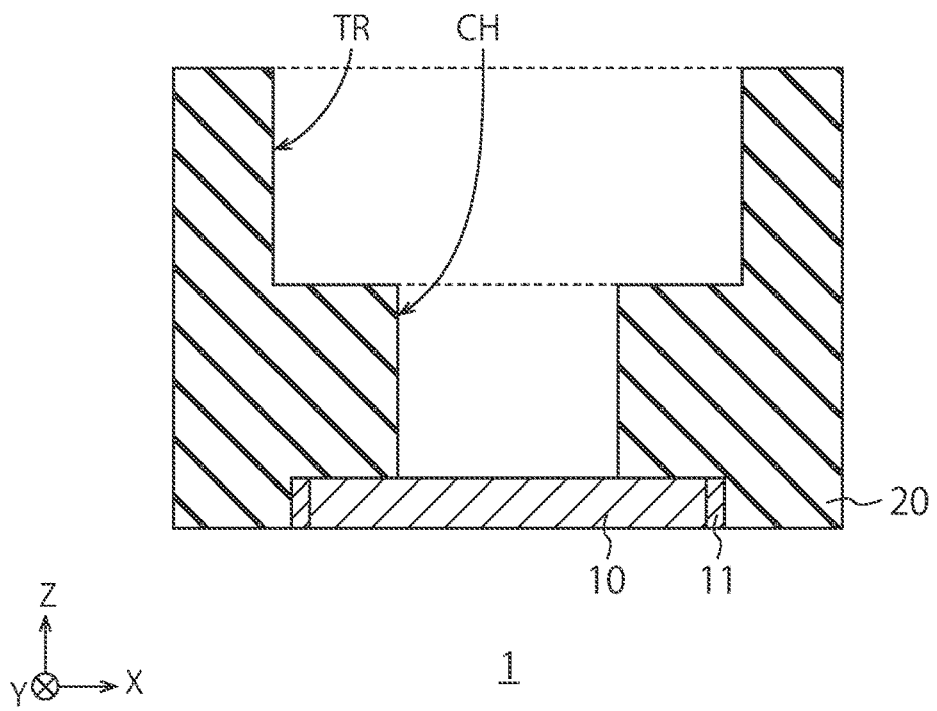

Next, the trench TR used for the upper interconnection INT is formed in the interlayer dielectric film 20 by lithography and etching. At this time, the trench TR overlaps the contact hole CH as viewed in the Z-direction, and the bottom of the contact hole CH is also etched simultaneously with etching of the trench TR. Accordingly, the trench TR is formed, and the contact hole CH reaches the lower interconnection 10. As illustrated in FIG. 4, the contact hole CH is thus transferred to a lower portion of the interlayer dielectric film 20 to be formed below the trench TR and communicate with the trench TR. The contact hole CH is substantially circular, substantially elliptical, or substantially polygonal in plan view as viewed in the Z-direction. The trench TR has an elongated shape extending in, for example, the Y-direction in plan view as viewed in the Z-direction. The trench TR is formed to be wider than the contact hole CH in an X-direction.

Figure 5:
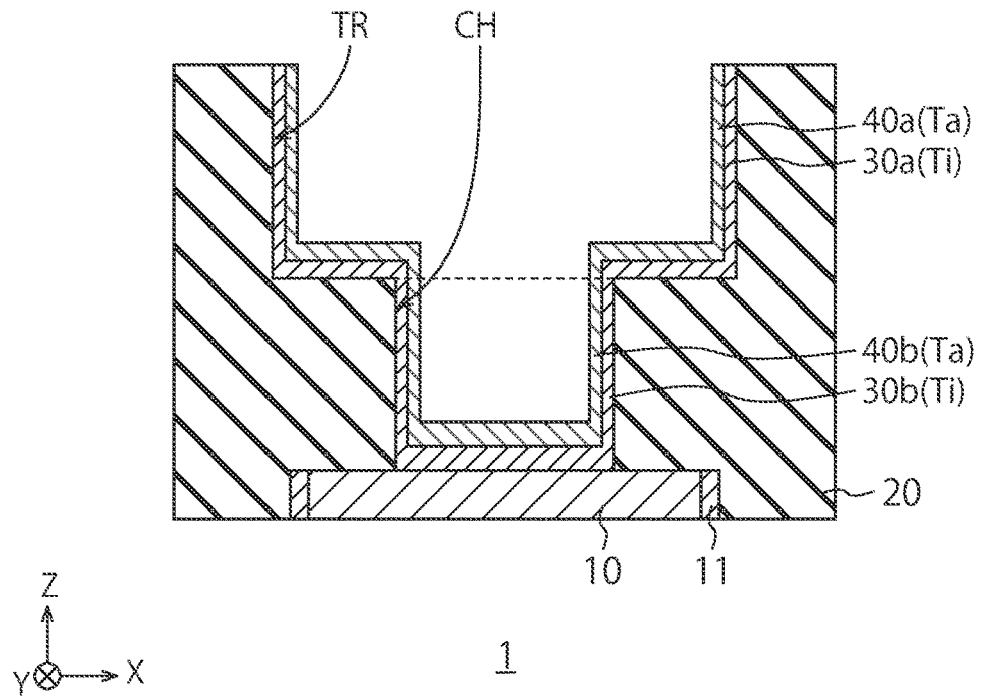

Next, as illustrated in FIG. 5, the metal layers 30a and 30b containing hexagonal titanium are formed simultaneously with each other on the inner wall of the contact hole CH and the inner wall of the trench TR. Titanium of the metal layers 30a and 30b has a crystal plane with a plane orientation (002). Next, the metal layers 40a and 40b containing tantalum having a body-centered cubic lattice-like structure are formed on the metal layers 30a and 30b. Tantalum of the metal layers 40a and 40b is α-Ta with a plane orientation (110). In order to increase the content of titanium having a crystal plane with a plane orientation (002) in the metal layer 30b and increase the content of α-Ta in the metal layer 40b to lower the resistance between the upper interconnection INT and the contact CNT, there is a method in which a pull-in radio-frequency (RF) bias to be applied to the semiconductor substrate is increased when the metal layer 30b is deposited, for example.

Next, the wiring materials 50a and 50b are formed on the metal layers 40a and 40b. The wiring material 50a and the metal layers 30a and 40a are then polished by CMP (Chemical Mechanical Polishing) or the like until the interlayer dielectric film 20 is exposed. Accordingly, the wiring material 50a is flattened as illustrated in FIG. 1, and the wiring materials 50a and 50b are buried in the contact hole CH and the trench TR. The contact CNT is substantially circular, substantially elliptical, or substantially polygonal in plan view as viewed in the Z-direction. The upper interconnection INT has an elongated shape extending in, for example, the Y-direction in plan view as viewed in the Z-direction. The upper interconnection INT is formed to be wider than the contact CNT in the X-direction.

Thereafter, another interlayer dielectric film, a multilayer wiring layer, and the like are formed, so that the semiconductor device 1 is completed.

As described above, the metal layers 40a and 40b containing tantalum are formed on the metal layers 30a and 30b containing hexagonal titanium having a crystal plane with a plane orientation (002). Tantalum of the metal layers 40a and 40b thus becomes α-Ta with a plane orientation (110). Titanium is less expensive than tantalum. Further, α-Ta has a lower specific resistance value than titanium. Therefore, the metal layers 30a, 30b, 40a, and 40b as barrier films become a laminated film of titanium and α-Ta which can be formed inexpensively with a low specific resistance value.

Second Embodiment

Figure 6:
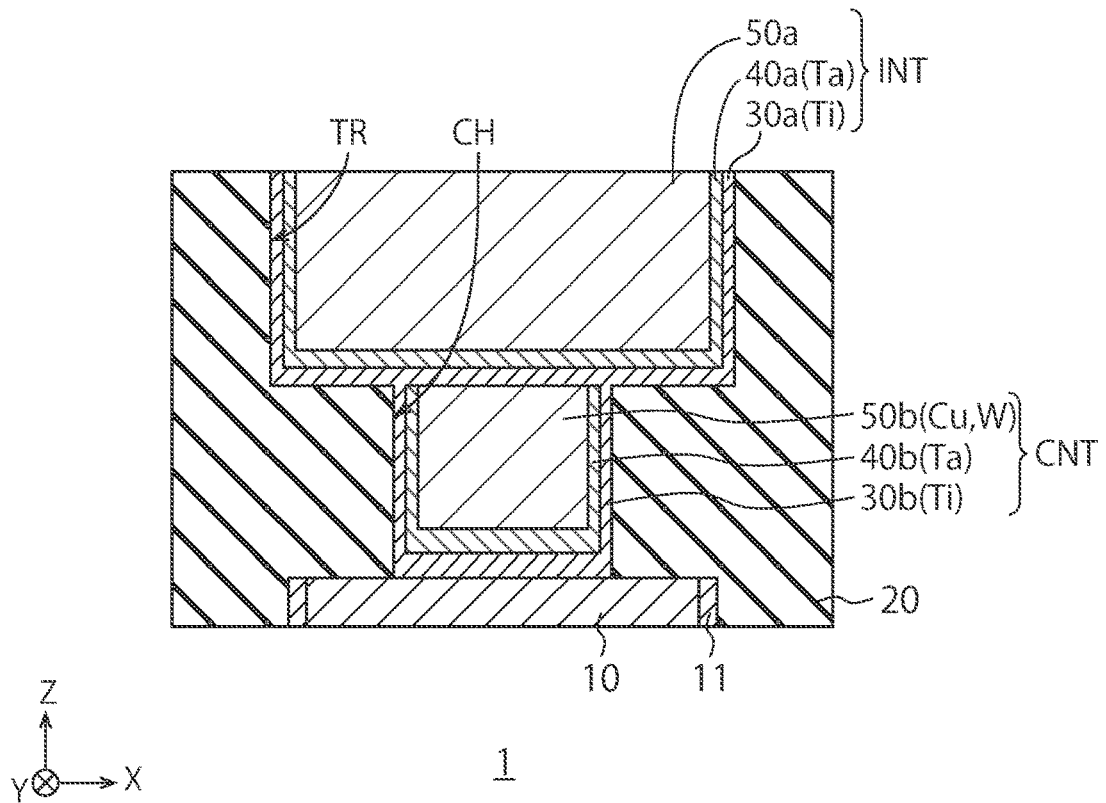
FIG. 6 is a cross-sectional view illustrating a configuration example of the semiconductor device according to a second embodiment.

FIG. 6 is a cross-sectional view illustrating a configuration example of the semiconductor device 1 according to a second embodiment. In the second embodiment, the contact CNT and the upper interconnection INT are formed separately from each other. Therefore, a laminated film of the metal layers 30a and 40a is provided between the wiring material 50b and the wiring material 50a. A laminated film of the metal layers 30b and 40b is provided between the lower interconnection 10 and the wiring material 50b as in the first embodiment.

The wiring material 50a and the wiring material 50b are separated from each other by the metal layers 30a and 40a as barrier films because the laminated film of the metal layers 30a and 40a is provided between the wiring material 50b and the wiring material 50a. Therefore, diffusion of the wiring materials 50a and 50b into each other can be prevented even in a case where the wiring materials 50a and 50b are made of materials different from each other. Meanwhile, the metal layers 30a and 40a become a laminated film of titanium and α-Ta, which has a low specific resistance value and therefore does not interfere with electrical connection between the wiring material 50a and the wiring material 50b.

Other configurations of the second embodiment are identical to corresponding configurations of the first embodiment. Therefore, the second embodiment can also obtain effects of the first embodiment.

Next, a manufacturing method according to the second embodiment is described.

Figure 7:
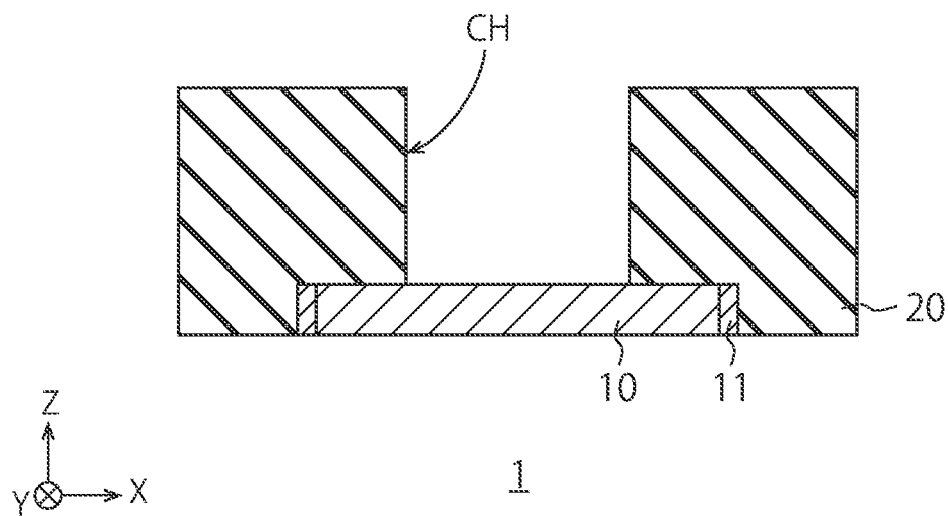
FIGS. 7 to 9 are cross-sectional views illustrating an example of the manufacturing method of a semiconductor device according to the second embodiment.
Figure 8:
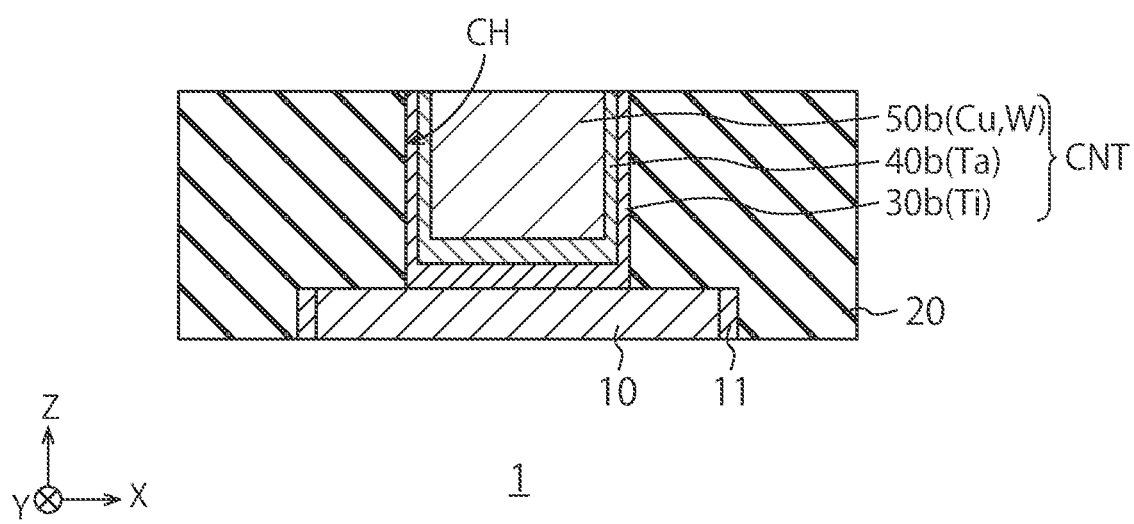
Figure 9:
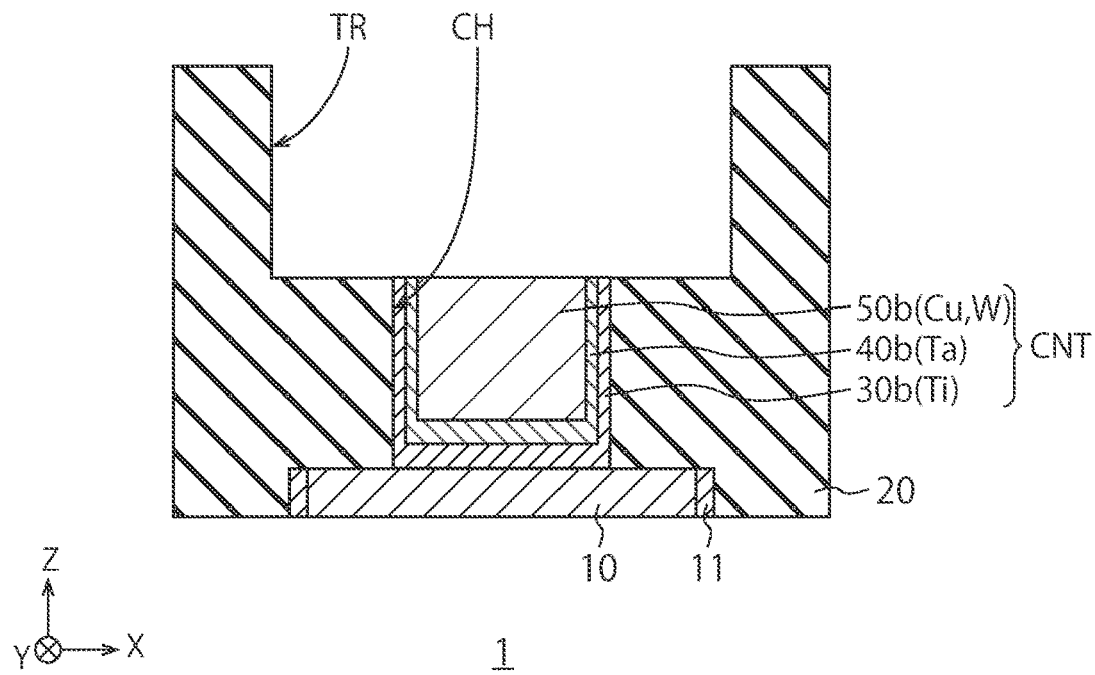

FIGS. 7 to 9 are cross-sectional views illustrating an example of the manufacturing method of a semiconductor device according to the second embodiment.

First, the semiconductor device undergoes the processes having been described with reference to FIG. 2.

Next, as illustrated in FIG. 7, the interlayer dielectric film 20 is formed above the lower interconnection 10. The interlayer dielectric film 20 is then etched by lithography and etching in a forming region of the contact CNT. The contact hole CH is formed to reach the lower interconnection 10. In this manner, the contact hole CH illustrated in FIG. 7 is formed in the interlayer dielectric film 20. The contact hole CH is substantially circular, substantially elliptical, or substantially polygonal in plan view as viewed in the Z-direction.

Next, as illustrated in FIG. 8, the metal layer 30b containing hexagonal titanium is formed on the inner wall of the contact hole CH and on the lower interconnection 10. Titanium of the metal layer 30b has a crystal plane with a plane orientation (002). Next, the metal layer 40b containing tantalum having a body-centered cubic lattice-like structure is formed on the metal layer 30b. Tantalum of the metal layer 40b is α-Ta having a crystal plane with a plane orientation (110).

Next, the wiring material 50b is formed on the metal layer 40b. The wiring material 50b and the metal layers 30b and 40b are then polished by CMP or the like until the interlayer dielectric film 20 is exposed. Accordingly, as illustrated in FIG. 8, the wiring material 50b is flattened and buried in the contact hole CH. In this manner, the contact CNT illustrated in FIG. 8 is formed.

Next, the interlayer dielectric film 20 is further formed on the contact CNT. Subsequently, the trench TR used for the upper interconnection INT is formed in the interlayer dielectric film 20 by lithography and etching. At this time, the trench TR overlaps the contact CNT as viewed in the Z-direction, and the contact CNT is exposed at the bottom of the trench TR by etching of the trench TR. Accordingly, the structure illustrated in FIG. 9 is obtained. The trench TR has an elongated shape extending in, for example, the Y-direction in plan view as viewed in the Z-direction. The trench TR is formed to be wider than the contact hole CH in the X-direction.

Next, the metal layer 30a containing hexagonal titanium is formed on the inner wall of the trench TR. Titanium of the metal layer 30a has a crystal plane with a plane orientation (002), as with the metal layer 30b. Next, the metal layer 40a containing tantalum having a body-centered cubic lattice-like structure is formed on the metal layer 30a. Tantalum of the metal layer 40a is α-Ta with a plane orientation (110), as with the metal layer 40b. Accordingly, the structure illustrated in FIG. 6 is obtained.

Thereafter, another interlayer dielectric film, a multilayer wiring layer, and the like are formed, so that the semiconductor device 1 is completed.

Third Embodiment

Figure 10:
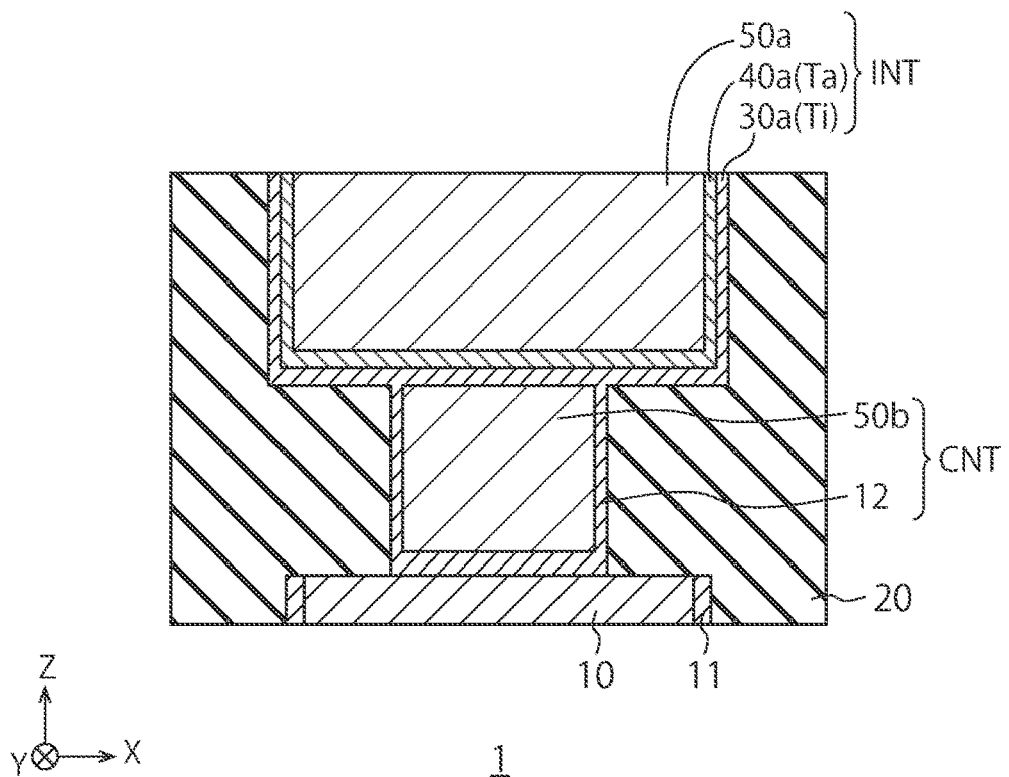
FIG. 10 is a cross-sectional view illustrating a configuration example of the semiconductor device according to a third embodiment.

FIG. 10 is a cross-sectional view illustrating a configuration example of the semiconductor device 1 according to a third embodiment. The third embodiment is the same as the second embodiment in that the contact CNT and the upper interconnection INT are formed separately from each other. However, a barrier film 12 of the contact CNT in the third embodiment is different from a laminated film of the metal layers 30b and 40b in the second embodiment. The contact CNT includes the barrier film 12 provided on the lower interconnection 10 and the wiring material 50b provided on the barrier film 12. The barrier film 12 may be the same as the barrier film 11. A conductive material, for example, titanium (Ti), titanium nitride (TiN), tantalum (Ta), or tantalum nitride (TaN) is used for the barrier film 12. A laminated film of the metal layers 30a and 40a is provided between the wiring material 50a and the wiring material 50b.

Other configurations of the third embodiment are identical to corresponding configurations of the second embodiment. Therefore, the upper interconnection INT has an identical configuration as the upper interconnection INT according to the second embodiment, and thus exerts identical effects as the interconnection INT of the second embodiment.

In a manufacturing method according to the third embodiment, it suffices that the barrier film 12 is formed in place of the metal layers 30b and 40b as barrier films illustrated in FIG. 8. That is, after the contact hole CH is formed in the interlayer dielectric film 20 as illustrated in FIG. 7, the barrier film 12 is formed on the inner wall of the contact hole CH. Subsequently, the wiring material 50b is formed on the barrier film 12 to be buried in the contact hole CH. Other manufacturing processes according to the third embodiment may be identical to corresponding processes according to the second embodiment.

Fourth Embodiment

Figure 11:
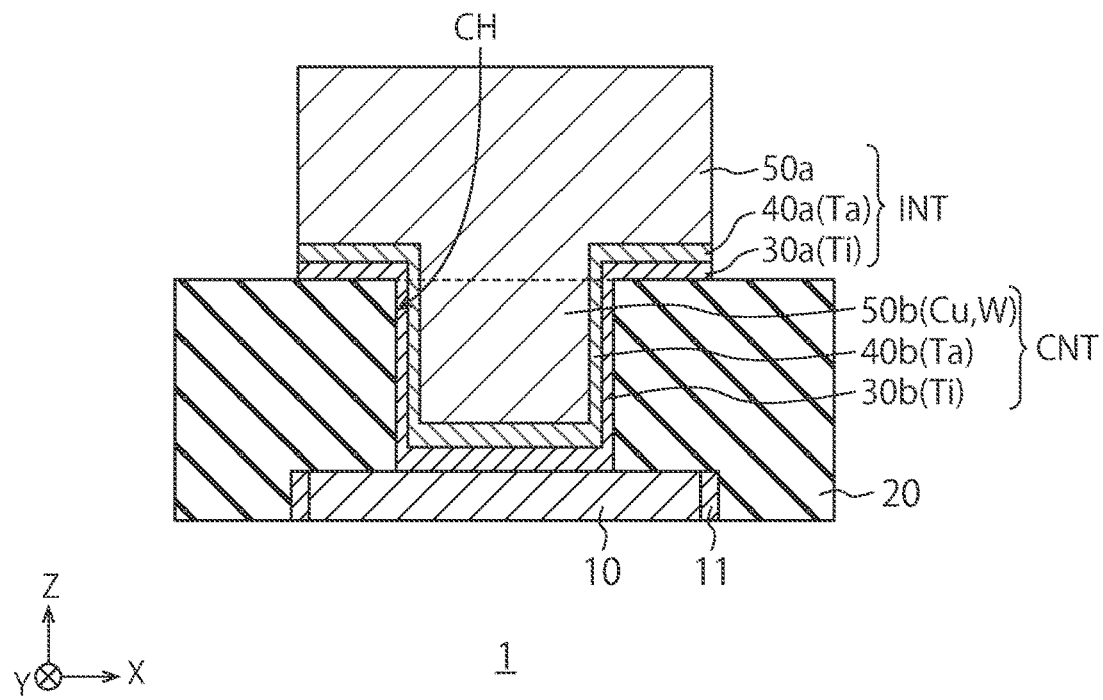
FIG. 11 is a cross-sectional view illustrating a configuration example of the semiconductor device according to a fourth embodiment.

FIG. 11 is a cross-sectional view illustrating a configuration example of the semiconductor device 1 according to a fourth embodiment. In the fourth embodiment, the contact CNT and the upper interconnection INT are simultaneously formed with each other, and the upper interconnection INT is formed by lithography and etching. Therefore, the upper interconnection INT is exposed from the interlayer dielectric film 20 in which the contact CNT is buried. The metal layers 30a and 40a as barrier films are not provided on the side surface of the wiring material 50a of the upper interconnection INT. The metal layers 30a and 40a are provided between the bottom surface of the wiring material 50a and the interlayer dielectric film 20.

Other configurations of the fourth embodiment are identical to corresponding configurations of the first embodiment. Therefore, the contact CNT has an identical configuration as the contact CNT according to the first embodiment, and thus exerts identical effects as the contact CNT of the first embodiment.

Figure 12:
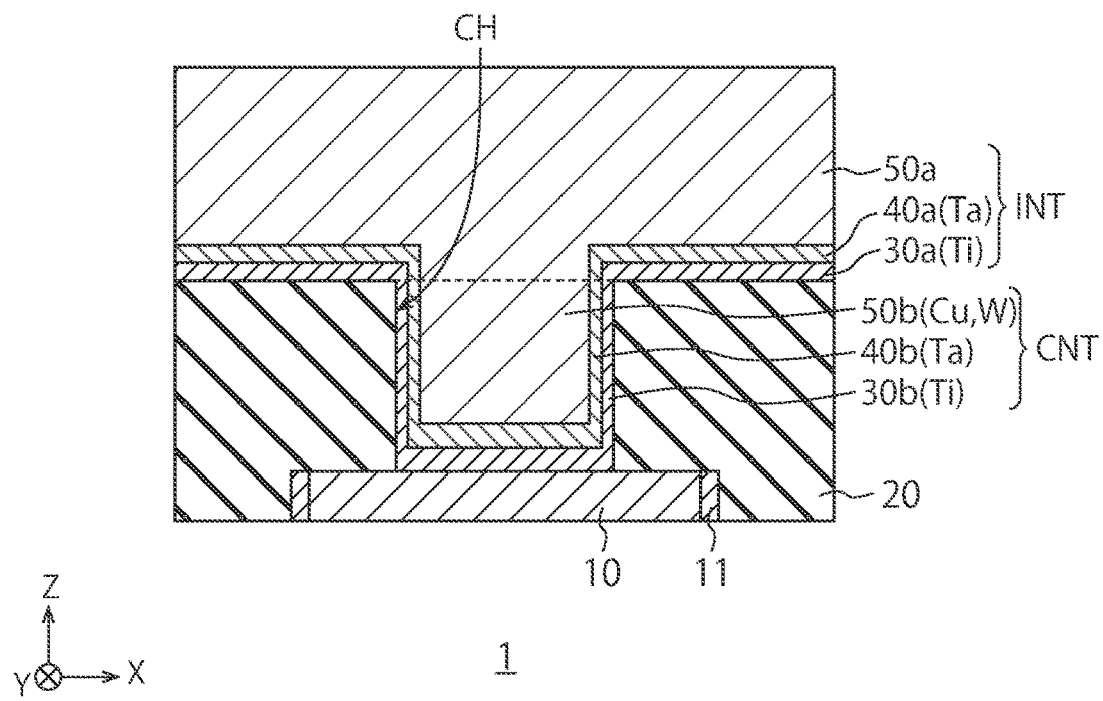
FIG. 12 is a cross-sectional view illustrating an example of a manufacturing method of a semiconductor device according to the fourth embodiment.

FIG. 12 is a cross-sectional view illustrating an example of a manufacturing method of a semiconductor device according to the fourth embodiment.

In the manufacturing method according to the fourth embodiment, as illustrated in FIG. 12, after the processes illustrated in FIG. 7 are performed, the metal layers 30a and 30b containing hexagonal titanium are formed on the interlayer dielectric film 20 and the inner wall of the contact hole CH. Titanium of the metal layers 30a and 30b has a crystal plane with a plane orientation (002). Next, the metal layers 40a and 40b containing tantalum having a body-centered cubic lattice-like structure are formed on the metal layers 30a and 30b. Tantalum of the metal layers 40a and 40b is α-Ta with a pane orientation (110). Next, the wiring materials 50a and 50b are formed on the metal layers 40a and 40b. Accordingly, the structure illustrated in FIG. 12 is obtained.

Next, the wiring material 50a and the metal layers 40a and 30a are processed in a pattern of the upper interconnection INT by lithography and etching. In this manner, the upper interconnection INT is formed on the contact hole CH as illustrated in FIG. 11.

Thereafter, another interlayer dielectric film, a multilayer wiring layer, and the like are formed, thereby completing the semiconductor device 1.

In a case where a laminated film of tantalum nitride (TaN) and tantalum (Ta) is used as a barrier film for the contact CNT or the upper interconnection INT, the specific resistance value of the barrier film is about 60 µohm·cm. This value is lower than the specific resistance value (about 80 µohm·cm) of a laminated film of titanium and α-Ta according to the present embodiment. However, the laminated film of tantalum nitride (TaN) and tantalum (Ta) takes a higher cost than the laminated film of titanium and α-Ta.

In a case where a single-layer film of titanium is used as the barrier film for the contact CNT or the upper interconnection INT, the cost becomes lower than that of the laminated film of titanium and α-Ta. However, its specific resistance value is higher than that of the laminated film of titanium and α-Ta.

On the other hand, the laminated film of titanium and α-Ta according to the present embodiment can make the specific resistance value to be low to some extent and can also lower the manufacturing cost. Consequently, the semiconductor device 1 according to the present embodiment can reduce a wire resistance or a contact resistance and can also reduce the manufacturing cost.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a first conductive layer;
an interconnection provided above the first conductive layer along a thickness direction of the semiconductor device; and
a contact provided between the first conductive layer and the interconnection along the thickness direction, wherein:
the interconnection includes:
a first metal layer containing hexagonal titanium (Ti), the first metal layer being provided above the first conductive layer along the thickness direction;
a second metal layer containing tantalum (Ta), the second metal layer having a body-centered cubic lattice-like structure and being provided on and in direct contact with the first metal layer; and
a first wiring material provided on and in direct contact with the second metal layer,
the second metal layer is provided between the first metal layer and the first wiring material along the thickness direction,
the first metal layer contains titanium having a crystal plane with a plane orientation (002), and
the second metal layer contains tantalum having a crystal plane with a plane orientation (110).

2. The device of claim 1, wherein a crystal interplanar spacing of the first metal layer is substantially equal to a crystal interplanar spacing of the second metal layer.

3. The device of claim 1, wherein a crystal interplanar spacing of the first metal layer is closer to a crystal interplanar spacing of tantalum having a crystal plane with a plane orientation (110) than to a crystal interplanar spacing of tantalum having a crystal plane with a plane orientation (002).

4. The device of claim 1, wherein the first wiring material is a conductive material containing any of tungsten (W), aluminum (Al), and copper (Cu).

5. The device of claim 1, wherein the contact includes a third metal layer containing hexagonal titanium (Ti) provided on the first conductive layer, a fourth metal layer containing tantalum (Ta) having a body-centered cubic lattice-like structure and provided on the third metal layer, and a second wiring material provided on the fourth metal layer.

6. The device of claim 1, wherein:
the first and second metal layers are provided between the first wiring material and the contact, and
the contact includes a fifth metal layer provided on the first conductive layer and a second wiring material provided on the fifth metal layer.

7. The device of claim 1, further comprising an insulation film in which the contact is buried,
wherein the interconnection is exposed from the insulation film.

8. The device of claim 5, wherein:
the first and second metal layers are provided between the first wiring material and the second wiring material, and
the third and fourth metal layers are provided between the first conductive layer and the second wiring material.

* * * * *